(12) United States Patent
Uttermann et al.

(10) Patent No.: US 8,941,990 B2
(45) Date of Patent: Jan. 27, 2015

(54) DEVICE FOOT

(76) Inventors: Erik A. Uttermann, Cupertino, CA (US); Rico Zorkendorfer, San Francisco, CA (US); Andrew Lauder, San Francisco, CA (US)

( * ) Notice: Subject to any disclaimer, the term of this patent is extended or adjusted under 35 U.S.C. 154(b) by 308 days.

(21) Appl. No.: 13/489,345

(22) Filed: Jun. 5, 2012

(65) Prior Publication Data

US 2012/0243153 A1     Sep. 27, 2012

Related U.S. Application Data

(63) Continuation of application No. 12/819,804, filed on Jun. 21, 2010, now Pat. No. 8,213,177.

(51) Int. Cl.
  *G06F 1/16*     (2006.01)
  *H05K 5/02*     (2006.01)

(52) U.S. Cl.
  CPC .............. *H05K 5/0234* (2013.01); *G06F 1/166* (2013.01)
  USPC ................................... 361/679.59; 248/188.8

(58) Field of Classification Search
  USPC .................................. 361/679.59; 248/188.8
  See application file for complete search history.

(56) References Cited

U.S. PATENT DOCUMENTS

| | | | | |
|---|---|---|---|---|
| 3,426,986 A * | 2/1969 | Pool | ............................ | 248/616 |
| 4,767,105 A * | 8/1988 | Caspers | ...................... | 267/140 |
| 4,923,158 A * | 5/1990 | Saisho | ...................... | 248/188.8 |
| 5,153,052 A * | 10/1992 | Tanaka et al. | ................. | 428/212 |
| 5,169,115 A * | 12/1992 | Chung Hsiang | ............. | 248/677 |
| 5,469,327 A * | 11/1995 | Cheng | ...................... | 361/679.55 |
| 5,957,420 A * | 9/1999 | Wang | .......................... | 248/188.8 |
| 6,053,589 A * | 4/2000 | Lin | ................................ | 312/271 |
| 6,097,592 A * | 8/2000 | Seo et al. | ................. | 361/679.55 |
| 6,357,717 B1 * | 3/2002 | Kennard, IV | ................. | 248/638 |
| 6,498,719 B1 * | 12/2002 | Bridges | ..................... | 361/679.34 |
| 6,979,778 B2 * | 12/2005 | Xiong et al. | ..................... | 174/50 |
| 7,048,247 B2 * | 5/2006 | Tanishima | .................... | 248/638 |
| 7,095,610 B1 * | 8/2006 | Banko | ...................... | 361/679.55 |
| 7,245,484 B2 * | 7/2007 | Langerhans et al. | ...... | 361/679.27 |
| 7,293,749 B2 * | 11/2007 | Banko | .......................... | 248/188 |
| 7,450,373 B2 * | 11/2008 | Lee et al. | ................. | 361/679.55 |
| 7,697,283 B2 * | 4/2010 | Mathew et al. | .......... | 361/679.59 |
| 7,817,418 B2 * | 10/2010 | Bailey | ...................... | 361/679.59 |
| 7,898,802 B2 * | 3/2011 | Lian | .......................... | 361/679.59 |
| 7,929,292 B2 * | 4/2011 | Li et al. | ..................... | 361/679.46 |

(Continued)

OTHER PUBLICATIONS

Chinese Application No. 201110165264.9—Office Action dated Aug. 22, 2013.

(Continued)

*Primary Examiner* — Lisa Lea Edmonds
(74) *Attorney, Agent, or Firm* — Womble Carlyle Sandridge & Rice, LLP

(57) ABSTRACT

A moveable device foot for an electronic device is described. The device foot can include a rigid weight bearing member and a flexible sealing member that is integrally formed with the weight bearing member. The device foot can be formed using a double-shot injection molding process. The weight bearing member of the foot can be mounted to an interior portion of the electronic device such that it extends through an external casing of the electronic device. The flexible sealing member can be mounted to the external casing to seal the interior of the electronic device. During operation of the electronic device, the device foot can be configured to move relative to the external casing, such as in response to an external force applied to the electronic device.

20 Claims, 6 Drawing Sheets

(56) References Cited

U.S. PATENT DOCUMENTS

| | | | |
|---|---|---|---|
| 7,959,117 B2* | 6/2011 | Chiu | 248/188.1 |
| 8,213,177 B2* | 7/2012 | Uttermann et al. | 361/679.59 |
| 8,537,128 B2* | 9/2013 | Uttermann et al. | 345/173 |
| 8,537,546 B2* | 9/2013 | Shih | 361/679.59 |
| 2003/0179543 A1* | 9/2003 | Sri-Jayantha et al. | 361/683 |
| 2007/0103859 A1* | 5/2007 | Yu | 361/683 |
| 2008/0055840 A1 | 3/2008 | Tanaka et al. | |
| 2008/0074831 A1 | 3/2008 | Lee et al. | |
| 2008/0198505 A1* | 8/2008 | Chuang | 360/98.01 |
| 2008/0226978 A1* | 9/2008 | Kim et al. | 429/163 |
| 2008/0251663 A1* | 10/2008 | Tracy et al. | 248/188.8 |
| 2008/0253081 A1* | 10/2008 | Tracy et al. | 361/687 |
| 2010/0001150 A1* | 1/2010 | Chiu | 248/188.8 |
| 2011/0303688 A1* | 12/2011 | Chen et al. | 220/694 |
| 2012/0007479 A1* | 1/2012 | Park | 312/223.2 |
| 2013/0075550 A1* | 3/2013 | Chiu et al. | 248/188.9 |
| 2013/0088819 A1* | 4/2013 | Dernier et al. | 361/679.01 |

OTHER PUBLICATIONS

Korean Patent Application No. 10-2012-7025720—Notice of Preliminary Rejection dated Nov. 26, 2013.
International Search Report dated Aug. 25, 2011, in PCT Application No. PCT/US2011/036846.
Written Opinion dated Aug. 25, 2011, in PCT Application No. PCT/US2011/036846.
Decision to Grant dated Nov. 3, 2011 in Chinese Utility Model Patent Application No. CN201120207436.X.

* cited by examiner

DEVICE FOOT

CROSS-REFERENCE TO RELATED APPLICATIONS

This application is a continuation of co-pending U.S. patent application Ser. No. 12/819,804, filed on Jun. 21, 2010, which is hereby incorporated herein by reference in its entirety.

BACKGROUND

1. Field of the Invention

The invention relates to consumer electronic devices and more particularly, methods and apparatus for providing moveable supports for consumer electronic devices.

2. Description of the Related Art

Most consumer electronic devices include a touch-based interface of some type, such as a key board, a touch screen, moveable buttons or the like. For touch-based interfaces with moveable components, a user's experience can be affected by feedback generated during actuation of the moveable component, such as a resistance to movement, a smoothness of the movement and a range of movement. Typically, users find certain combinations of touch-based feedback more pleasing to the touch than other combinations. In addition, from a visual stand point, users often find compact and sleek designs more aesthetically appealing. Sleek and compact designs that are visually appealing tend to have compact enclosures that leave little room for a wide range of movement associated with touch-based interface components.

Therefore, for use in consumer electronic devices, components are desired that increase a range of movement associated with a touch based interface while allowing an over-all sleek and compact design to be maintained.

SUMMARY

Broadly speaking, the embodiments disclosed herein describe a moveable device foot well suited for use in a consumer electronic device, such as a device including a touch-based interface. In particular, a moveable device foot for an electronic device is described. When the electronic device is placed on a surface, the moveable device foot can be used to support a portion of the weight of the electronic device. In addition, in response to a touch-based input, the moveable device foot can be configured to contribute to a range of movement associated with the touch-based interface.

In particular embodiments, the moveable device foot can include a rigid weight bearing member and a flexible sealing member or a cosmetic member that are integrally formed. The weight bearing member of the foot can be mounted to an interior portion of the electronic device such that it extends through an external casing of the electronic device. When a flexible sealing member is used, it can be mounted to the external casing to seal the interior of the electronic device. During operation of the electronic device, the device foot can be configured to move relative to the external casing, such as when an external force is applied to the electronic device. The external force can result from a user interaction with the electronic device, such as during a touch-based input process.

When the electronic device rests on a surface, such as a desk, an internal mechanism, coupled to the device foot, can be configured to hold the device foot in a position where it extends a maximum distance through the external casing. In one embodiment, the internal mechanism can be part of a switch. The internal mechanism can be configured to support a portion of the weight of the electronic device where the portion of the weight that is supported by the internal mechanism is transmitted through the device foot. In response to an external force of sufficient magnitude being applied to the electronic device, such as a user pressing down on top of the electronic device to provide a touch input, the device foot can be configured to recede into the external casing, which allows the external casing to move towards the surface. When the external force is removed, the internal mechanism can return the foot to its original extended position and the external casing can move away from the surface.

In one embodiment, the device foot can be formed using a double-shot injection molding process. In the first shot, the rigid weight bearing member, including an interior hollow portion, can be formed. During the second shot, the flexible sealing member can be formed. To anchor the flexible sealing member of the foot to the rigid weight bearing member, a portion of the flexible sealing member can be extruded into the hollow interior portion of the rigid weight bearing member during the second shot. The materials used for the flexible sealing member can be selected so that the flexible member and the rigid member do not bond together during the injection molding process and can easily separate from one another when the two components are pulled apart.

Other aspects and advantages will become apparent from the following detailed description taken in conjunction with the accompanying drawings which illustrate, by way of example, the principles of the invention.

BRIEF DESCRIPTION OF THE DRAWINGS

The described embodiments will be readily understood by the following detailed description in conjunction with the accompanying drawings, wherein like reference numerals designate like structural elements, and in which.

DETAILED DESCRIPTION OF THE DESCRIBED EMBODIMENTS

Figure 1:
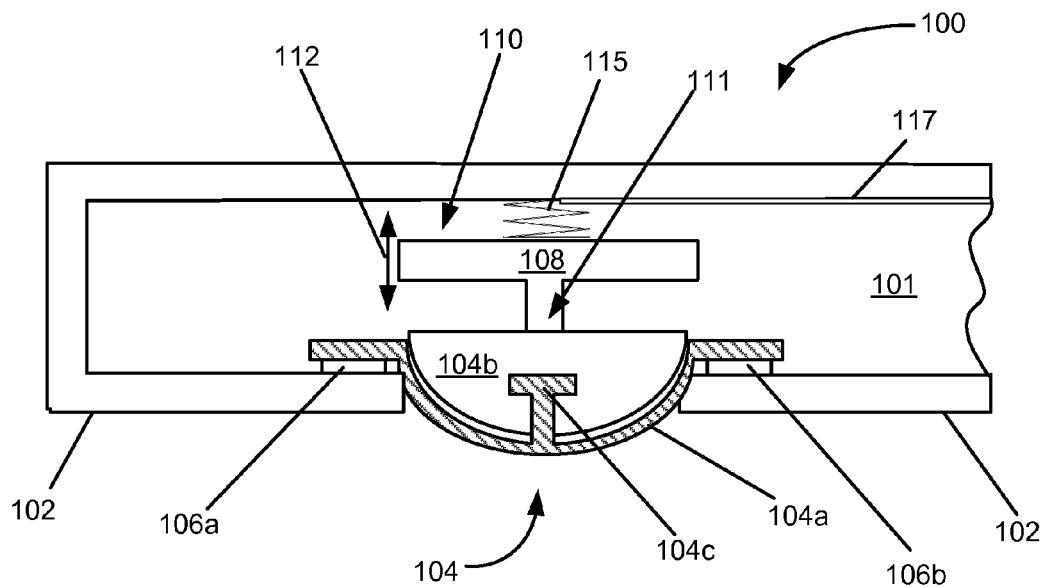
FIG. 1 shows a side view of an electronic device including a moveable foot in a first position in accordance with the described embodiments.

In the following detailed description, numerous specific details are set forth to provide a thorough understanding of the concepts underlying the described embodiments. It will be apparent, however, to one skilled in the art that the described embodiments can be practiced without some or all of these specific details. In other instances, well known process steps have not been described in detail in order to avoid unnecessarily obscuring the underlying concepts.

Broadly speaking, the embodiments disclosed herein describe a moveable device foot well suited for use in compact consumer electronic devices. In particular, the moveable device foot can be used with electronic devices that utilize a touch-based interface. When the electronic device is placed on a surface, one or more moveable device feet can be used to support the weight of the electronic device. In response to a touch-based input, the moveable device feet can be configured to contribute to a range of movement associated with the touch-based interface. The moveable device foot can be used with electronic devices, such as keyboards, touch pads, mice, table computers, portable computers, portable media players, portable phones and the like. Components such as the keyboard and touch pad are integrated with the electronic device or provided as separate components from the electronic device.

In particular embodiments, the moveable device foot can include a rigid weight bearing member and a flexible sealing member or a cosmetic member integrally formed with the weight bearing member. These components can be integrally formed using a double shot injection molding process. When used with an electronic device, the weight bearing member of the foot can be mounted to an interior portion of the electronic device such that it extends through an external casing of the electronic device. When a flexible sealing member is used, it can be mounted to the external casing to seal the interior of the electronic device. During operation of the electronic device, the device foot can be configured to move relative to the external casing, such as when an external force is applied to the electronic device during a touch-based input to a touch-based interface. In one embodiment, the movement can cause the flexible sealing member to separate from the rigid weight bearing member. In other embodiments, such as in the case of the cosmetic member, the cosmetic member and the rigid weight bearing member can move together.

These and other embodiments are discussed below with reference to FIGS. 1-10. However, those skilled in the art will readily appreciate that the detailed description given herein with respect to these figures is for explanatory purposes only and should not be construed as limiting. In particular, with respect to FIGS. 1, 2, 8 and 9, electronic devices with one or more moveable device feet are described. With respect to FIGS. 3-7, one embodiment of a moveable device foot is discussed. Finally, with respect to FIG. 10, methods of manufacturing and utilizing the moveable device foot, such as the double shot molding process, are described.

FIG. 1 shows a side view of an electronic device 100 including a moveable foot 104 in a first position in accordance with the described embodiments. The electronic device can include an external casing 102 with an interior volume 101. The external casing 102 can be formed from one or more suitable materials, such as metals and/or plastics. A number of electronic components, such as, but not limited to, processors, memory, connection circuitry, antennas, speakers, sensors, display components, can be packaged within the casing 102. In particular embodiments, a touch-based interface can be associated with the electronic device where a processor and memory can be used to process input signals associated with the touch based interface, such as sensors and/or actuators configured to detect touch-based inputs. The processor and memory can be formed as a part of an integrated controller.

In one embodiment, the moveable foot 104 can include a flexible sealing member 104a and a rigid weight bearing member 104b. In this embodiment, the flexible sealing member 104a can be used to help seal an interior portion of the electronic device. Towards this end, the flexible sealing member 104a can be attached to the external casing to form a seal.

In another embodiment, a member can be coupled to the weight bearing member 104b as part of a cosmetic reveal. This type of member can be referred to as a "cosmetic member." In this embodiment, the primary purpose of the cosmetic member is not for sealing but to cap the rigid weight bearing member 104b and improve its cosmetic appearance. Therefore, the cosmetic member may not be attached to the external casing but can be if desired. In one embodiment, the cosmetic member and the rigid weight bearing member 104b can move as a single piece and the cosmetic member may not separate from the rigid weight bearing member 104b during operation.

During operation, a portion of the weight of the electronic device can be transmitted through moveable foot 104 including the flexible sealing member 104a and the rigid support member 104b. For instance, when the electronic device 100 is placed on a surface, such as a table, and the moveable foot is resting on the surface, a portion of the electronic device's weight can be carried by the moveable foot 104.

An electronic device, such as 100, can include one or more moveable device feet through which a portion of the weight of the electronic device can be transmitted. Further, the electronic device can include other types of supports, such as a non-moveable device foot (secured in a fixed position) that can also support a portion of the weight of the electronic device. Thus, depending on a number of supports, including moveable and non-moveable supports, that are used, the amount of weight transmitted through each device foot can vary. In various embodiments, an electronic device, such as 100, can include multiple device feet where each device foot can include a flexible sealing member or a cosmetic member.

The terms "flexible" and "rigid" in the flexible member and the rigid member can refer to amount of expected movement associated with each member during operation. The flexible member can be configured to give or move more than the rigid member during actuation of the moveable foot 104 because of its geometry. For instance, the flexible member can be configured to give or move more than the rigid member during operation because it is thinner the rigid member. Thus, in some embodiments, the flexible and rigid members can be formed from a common material where the relative flexibility/rigidity of each member is primarily affected by its associated geometry.

In other embodiments, different materials can be used for each member. The material properties of each member in conjunction with their geometry can affect an expected amount of movement of each member during operation of the moveable foot. For instance, the flexible member can be constructed from a material that is stiffer than the rigid member but because of its thinner geometry, it can still be expected to move more than the rigid member. In other embodiments, the rigid member can be constructed from a material that is stiffer than the flexible member where the less stiff material used with the flexible member can be used to increase its range of movement.

In one embodiment, material selection can be based upon, a coefficient of friction associated with the material. For instance, a portion of the device foot 104 can be configured to be in contact with a surface during operation. The material for the portion of the device foot in contact with the surface can be selected to have a higher friction coefficient so that it sticks more to the surface and prevents the electronic device from sliding. For instance, in one embodiment, a cosmetic cap can be coupled to the rigid portion of the device foot for cosmetic appeal and to increase the stickiness of the device foot.

The rigid support member can include a hollow interior portion 104c. During manufacture, such as using an injection molding process, a portion of the flexible sealing member can be extruded into weight bearing member 104b. The portion of the flexible sealing member extruded into the hollow interior portion 104c of member 104b can serve to anchor the flexible sealing member 104a to the rigid weight bearing member 104b. In the example in FIG. 1, the interior portion 104c includes a shaft and a wider base portion, where material extruded into the wider base portion can act as a plug that prevents the flexible sealing member from being detached from the rigid weight bearing member. Additional details of manufacturing methods that can be used to form the moveable foot in this manner are described with respect to FIG. 10.

In another embodiment, the flexible sealing member 104a and the rigid weight bearing member 104b can be formed separately. Then, the flexible sealing member and the rigid weight bearing 104b member can be joined together using a bonding agent of some type. In this embodiment, the rigid weight bearing member may not include a hollow interior portion because the bonding agent is used to anchor the flexible sealing member 104a to an outer surface of the rigid weight bearing member 104b.

In a particular embodiment, the flexible sealing member 104a and the rigid weight bearing member 105b can be separately formed and not bonded or anchored. For instance, the flexible sealing member 104a can be attached to the casing 102 and the rigid weight bearing member can be attached to the interior of the electronic device. During operation, the rigid weight bearing member 104b can be configured to move relative to the casing and push against the flexible sealing member 104a. For instance, when the rigid weight bearing member 104b is extended outwards from the casing, it can push against the flexible sealing member 104a and stretch it outwards. In yet another embodiment, where the flexible sealing member 104a and the rigid weight bearing member 104b can be separately formed and not bonded or anchored together, the flexible sealing member 104a can be formed from an elastic material and stretched over the rigid weight bearing member 104b and attached to the external casing to place the flexible sealing member 104a in tension. The tensile forces stored in the flexible sealing member 104a can act to keep at least a portion of the flexible sealing member 104a in contact with the rigid weight bearing member 104b.

The flexible sealing member 104b can be bonded to the external casing 102 via a bonding agent of some type, such as but not limited to an adhesive applied in a liquid state or an adhesive tape. Two locations, 106a and 106b, where the bonding agent is applied is shown in FIG. 1. The bonding agent can be applied around a perimeter of the flexible sealing member 104b to the seal the interior 101 of the electronic device 100 such that external agents, such as dirt, dust and water, can be prevented from entering an interior 101 of the electronic device 100.

The rigid weight bearing support member 104b of the moveable foot 104 can be coupled to one or more internal components, such as 108. In one embodiment, in a first position, a portion of the weight bearing support member 104b can be configured to extend through an aperture in the external casing 102. When device foot 104 is placed on a surface, a height of the casing 102 above the surface can be raised. The height that the casing is raised can depend upon how much the moveable foot 104 is configured to extend from the external casing 102 and a desired range of movement to be provided by the moveable foot. The moveable foot 104 can be configured to move up or down 112 such that the portion of the moveable foot 104 that extends from the external casing can vary. For instance, the moveable foot 104 can be configured to recede into the external casing 102 in response to an application of an external force to the casing 102 or to the foot itself. Further details of the movement of the foot 104 in response to an external force are described with respect to FIG. 2.

The moveable foot 104 can be coupled to one or more energy storing mechanisms that can act to hold the moveable foot 104 in a first position when a magnitude of an applied external force is below some threshold value. For instance, the moveable foot may not move from its first position until a touch input above a certain value is generated. Further, when a position of the moveable foot relative to the external casing has changed as the result of the application of the external force, the energy storing mechanisms can act to return the moveable foot to its first position prior to the application of the external force. For instance, the moveable foot may return to the first position after a touch input previously generated is removed.

In one embodiment, the moveable foot 104 can be configured as part of an actuatable switch or sensor, such as but not limited to a dome switch represented by energy storing mechanism 115, such as a spring, depicted in FIG. 1 as being coupled with an interior surface of external casing 102 that returns the foot to an extended position after it is depressed. For example, once the dome switch is actuated a signal can be transmitted to internal electronics within external casing 102 by way of electrically conductive pathway 117. In another embodiment, the moveable foot 104 can be configured to press against a switch including a lever where the lever moves in response to the external force. A spring coupled to the lever, can act as an energy storage mechanism to return the lever and the moveable foot back to its initial position after the force is removed. The switch can include a sensor that allows a contact between two parts of the switch, such as an electrical contact, to be detected.

In further detail, the energy storing mechanism, such as 115, can be configured to hold the moveable foot 104 in a position where it extends a maximum distance through the external casing 102 when the moveable foot is supporting at least a portion of the weight of the electronic device 100 (a portion of the force that is generated can also be used to hold the flexible sealing member 104b in a stretched position when the moveable foot 104 is extended). In response to an additional external force being applied to the electronic device, such as a user pressing down on top of the electronic device 100 with sufficient force (see FIG. 2), the moveable foot 104 can be configured to recede into the external casing 102. When the external force is removed, then the energy storing mechanism, such as 115, can return the foot to its original extended position, as is shown in FIG. 1.

In particular embodiments, the energy storing mechanism 115 can be a device, such as an elastic spring or an elastic piece of foam that is compressed when an external force is applied. The energy storing mechanism 115 can be formed from material(s) that store a sufficient amount of energy resulting from the compression to return itself to its pre-compressed state and return the moveable foot 104 to its extended position when the external force is removed. In other embodiments, the energy storing mechanism 115 can be a device, such as an elastic spring, that is stretched when an external force is applied. The energy storing mechanism can be formed from a material(s) that stores a sufficient amount of energy to return itself to its pre-stretched condition and hence return the moveable foot to its initial position when the external force is removed.

The configuration in FIG. 1 is provided for illustrative purposes only and is not meant to be limiting. Many configurations involving one or more energy storing mechanisms, such as 115, placed at various positions relative to the moveable foot are possible. For instance, internal component 108 could be anchored to the casing 102 and a portion of the shaft 111 of the internal component could extend into a hollow portion of the foot 104. A spring could be placed over the shaft 111 to allow a portion of the shaft 111 that extends into the foot 104 to vary depending on an amount of external force that is applied to the external casing 102. In particular, when no external force is generated, the moveable foot 104 can be extended to its maximum position and when an external force is generated above a certain value, the amount of the foot 104 that is extended decreases as the shaft 111 moves into the foot 104.

Figure 2:
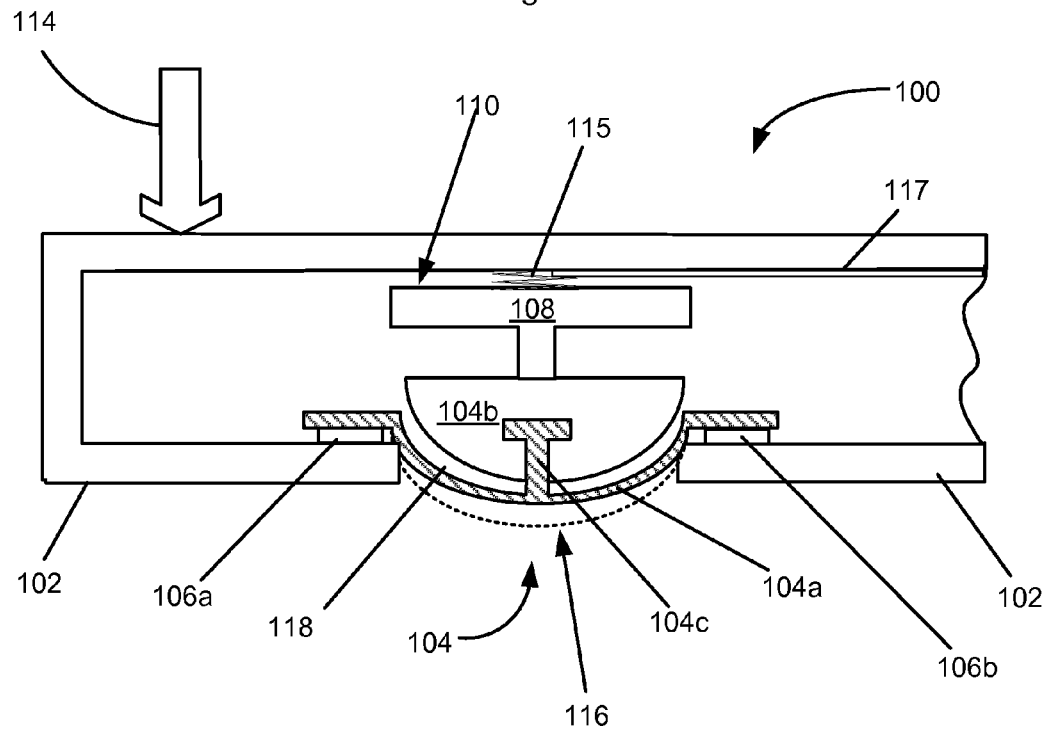
FIG. 2 shows a side view of an electronic device including a moveable foot in a second position in accordance with the described embodiments.

FIG. 2 shows a side view of an electronic device 100 including a moveable foot 104 in a second position in accordance with the described embodiments. An external force 114 is shown being applied to the external casing 102. In response, the foot 104 moves inward into the external casing 102. The first position of the foot 104 before the external force is applied is indicated by curve 116. In response to the external force 114, the energy storing mechanism, such as spring 115, is compressed, which loads the spring. When the external force 114 is removed, the spring 115 can release its stored energy and the device foot can be restored to the first position.

The moveable foot 104 can be configured to allow a maximum amount of movement. In one embodiment, the foot can move a maximum of 0.5 mm or less into the external casing. In another embodiment, the foot can move a maximum of 1 mm or less into the external casing. When the external force 114 is large enough to result in a movement but below a certain value, the foot 104 may move but may not move its maximum allowable distance.

When the foot 104 moves inward, the space distribution in the external casing 102 can change. For instance, in response to the application of the external force 114, the space 110 between component 108 and the external casing 102 can decrease (see space 110 in FIGS. 1 and 2.) Further, the space 118 between the rigid weight bearing member 104b and the flexible sealing member 104a can increase. In one embodiment, as described above, the flexible sealing member 104a can be stretched over the weight bearing member to decrease the amount of separation that occurs between the two members when the foot 104 is moved.

The external force 114 can be provided by a user pushing on the external casing 102. For instance, the user can push on the external casing 102 to generate force 114 using one or more of their fingers. The movement of external casing 102 in response to the user's push can provide additional feedback to the user, such as when the user is generating the external force 114 to provide an input into the electronic device 100. The additional feedback can improve a user's experience associated with utilizing the electronic device 100 to provide touch-based inputs.

In the embodiment in FIGS. 1 and 2, the flexible sealing member 104a is on top of the rigid weight bearing member 104b such that the weight bearing member 104b is covered and is not visible. In another embodiment, the flexible sealing member 104a can be anchored on a bottom flat portion of member 104b proximate to element 108 such that a bare member 104b can extend from the external casing 102 while the flexible sealing member 104a provides a seal behind it. The curved top portion of member 104b can be a solid surface. The flexible sealing member 104a can still be extruded into an interior portion of the rigid member 104b to anchor the flexible sealing member to the rigid member 104b via one or more shafts exiting on the bottom portion of the rigid member 104b as opposed to the top as is shown in FIGS. 1 and 2. In this embodiment, the flexible sealing member 104a may be flatter and more disk-shaped since it does not have to fit over member 104b.

Figure 3:
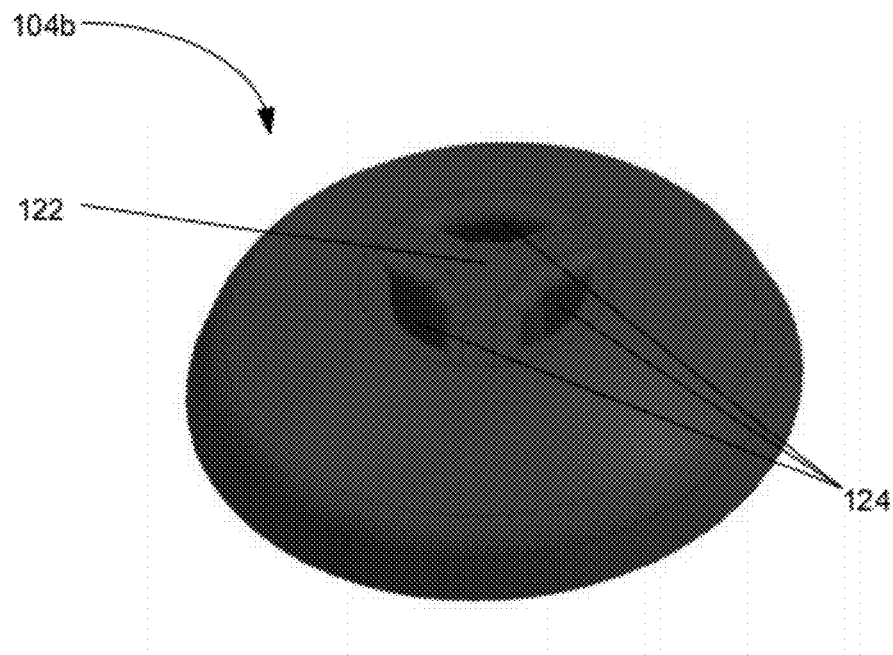
FIG. 3 shows a top perspective view of a rigid portion of the moveable foot in accordance with the described embodiments.

FIG. 3 shows a top perspective view of a rigid portion 104b of the moveable foot 104 in accordance with the described embodiments. The rigid portion 104b includes a solid center portion 122 surrounded by three shafts 124. The weight of the electronic device can be transmitted via the solid center portion 122. During manufacture, portions of the flexible sealing member 104a can be extruded into each of the three shafts 124 to anchor the sealing member 104a to the rigid weight bearing portion 104b.

The rigid portion 104b is circular. In other embodiments, the rigid portion 104b can comprise other shapes, such as a rectangular cross section. The rigid portion is not limited to being circular shaped. The external casing through which member 104b extends can have an aperture with a similar shape as member 104b to allow the member 104b to extend through the casing.

Figure 4:
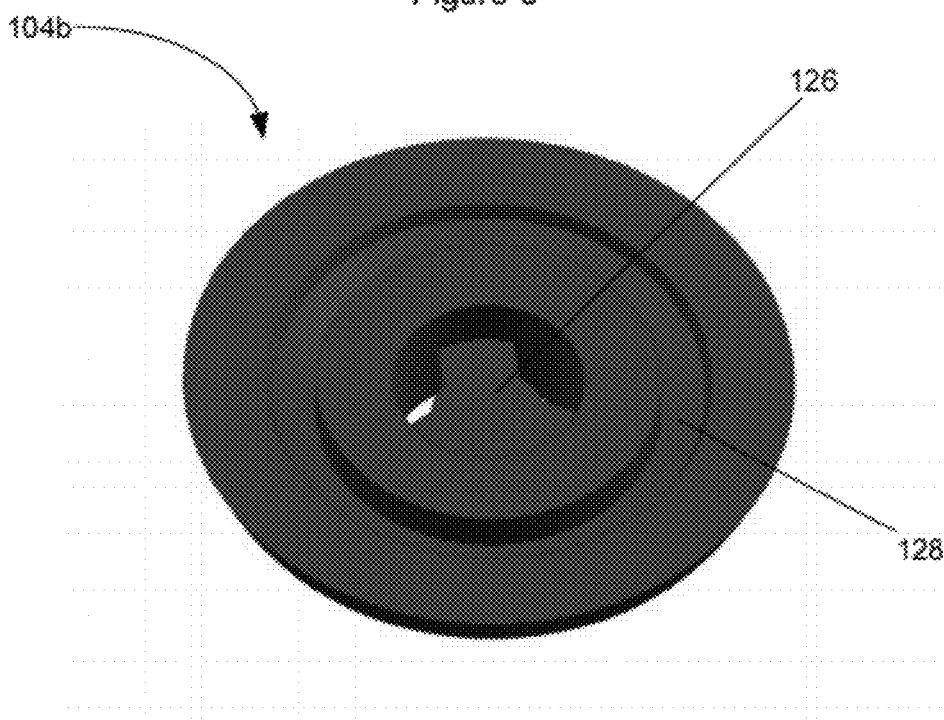
FIG. 4 shows a bottom perspective view of a rigid portion of the moveable foot in accordance with the described embodiments.

FIG. 4 shows a bottom perspective view of a rigid portion 104b of the moveable foot 104 in accordance with the described embodiments. The rigid portion 104b can include a chamber 126 underneath the solid center portion 124. The material extruded into each of the shafts 124 can bond together after it is extruded to anchor the flexible sealing member 104a to the rigid weight bearing member 104b.

The bottom portion of the rigid weight bearing member 104b can include one or more channels, such as 128. A channel, such as 128, can be provided to allow another component to be coupled to the member 104b, such as component 108 shown in FIGS. 1 and 2. For instance, component 108 can include a raised portion configured to fit into channel 128. Also, in yet further embodiments, the rigid weight bearing member 104b can include a raised portion that is configured to fit into a depression in the component 108. In other embodiments, a channel, such as 128, or other feature can be added to simplify the manufacturing process. For instance, in an injection molding process, the channel may minimize the sink associated with the application.

Figure 5:
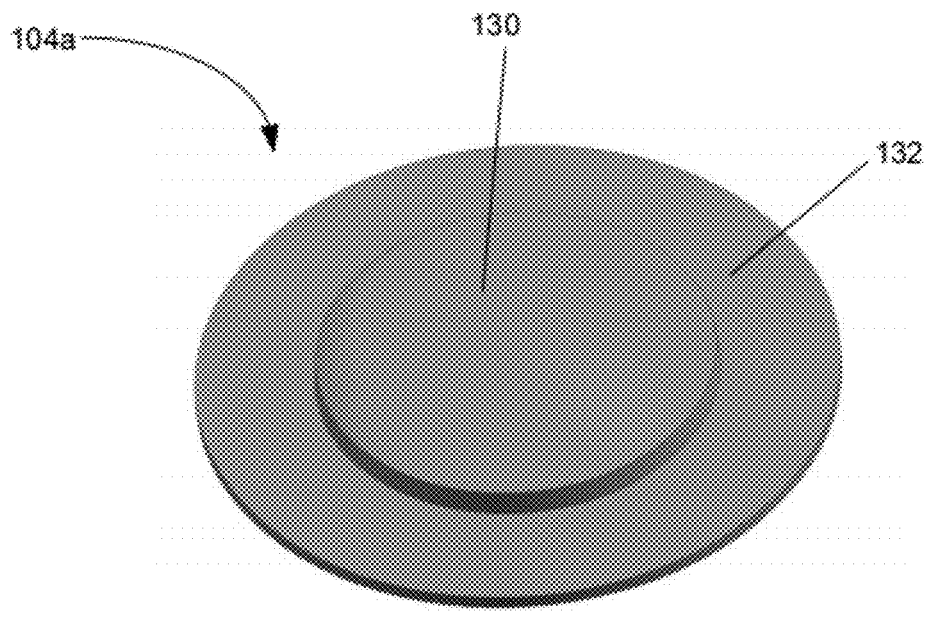
FIG. 5 shows a top perspective view of a flexible portion of the moveable foot in accordance with the described embodiments.

FIG. 5 shows a top perspective view of a flexible portion 104 of the moveable foot 104 in accordance with the described embodiments. The top portion of the flexible sealing member 104a includes an outer flat portion 132 and an inner portion 130. In this embodiment, the inner portion 130 is dome-shaped. The inner portion 130 can cover a dome-shaped rigid portion as is shown in FIGS. 3 and 4 and the outer flat portion 132 can be bonded to a surface, such as external casing 102, as is shown in FIGS. 1 and 2. The width of the outer portion 132 can be increased or decreased to increase or decrease a potential bonding area between a surface, such as an external casing of an electronic device, and the flexible sealing member 104a.

The inner portion 130 and the outer portion 132 of the flexible sealing member 104a do not have to be the same shape. For instance, in one embodiment, the inner portion 130 can be circular shaped while the outside perimeter of the outer portion 132 is square or rectangular shaped. In another example, the inner portion 130 can be square shaped and the outside perimeter of the outer portion 132 can be circular shaped.

Figure 6:
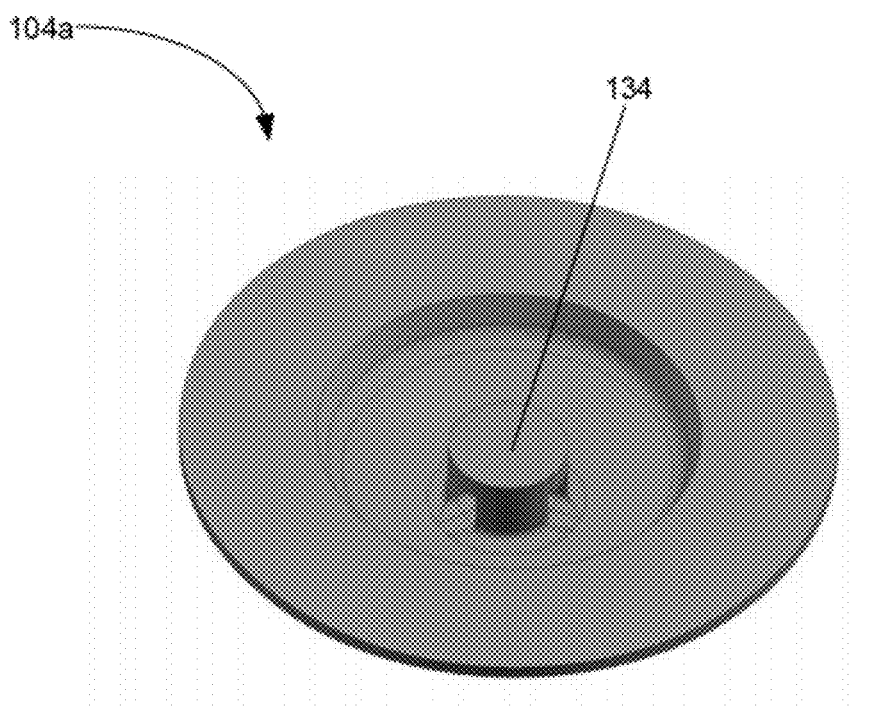
FIG. 6 shows a bottom perspective view of a flexible portion of the moveable foot in accordance with the described embodiments.

FIG. 6 shows a bottom perspective view of a flexible portion 104a of the moveable foot 104 in accordance with the described embodiments. The bottom side of the flexible portion 104a includes a plug 134. During manufacture, the plug 134 can be formed around the top and into an interior portion of the rigid member 104b (see FIGS. 3 and 4). The plug 134 can include three shafts that are joined together to conform to the shape of the rigid member 104b shown in FIGS. 3 and 4. Different plug shapes are possible and are not limited to the plug design shown in FIG. 6. As previously described, the plug can anchor the flexible sealing member 104a to the rigid weight bearing member 104b.

Figure 7:
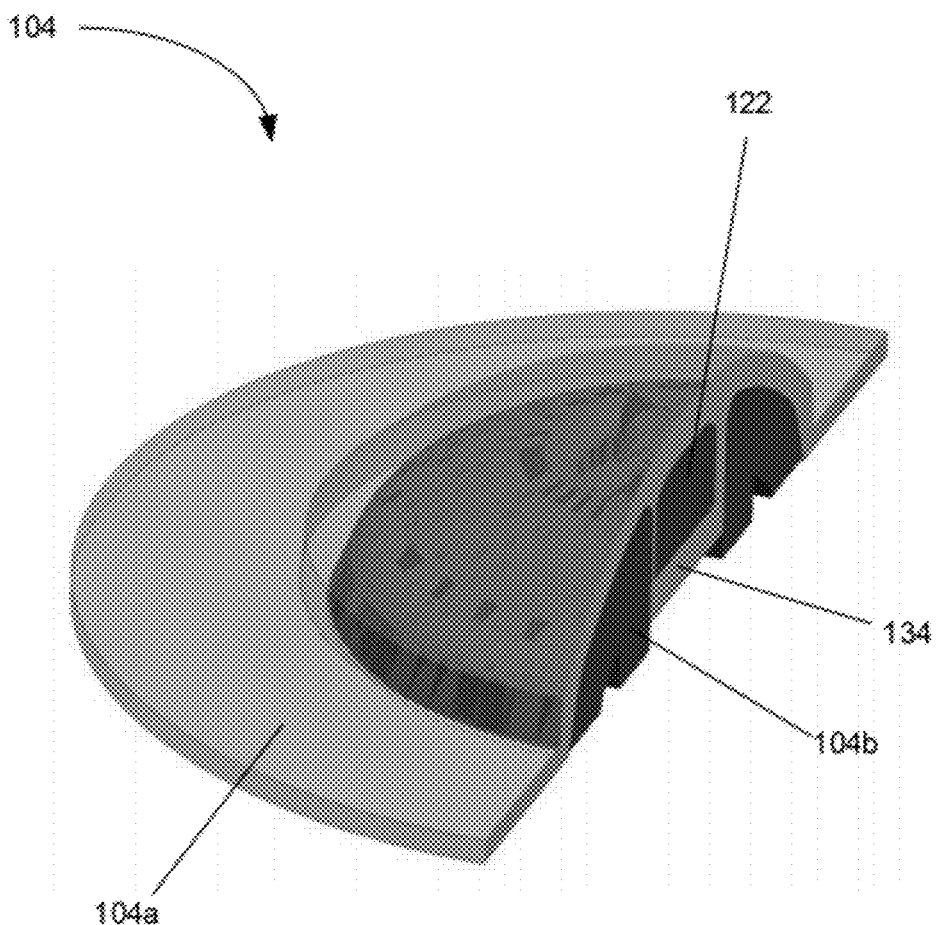
FIG. 7 shows a perspective and cross sectional view of the moveable foot in accordance with the described embodiments.

FIG. 7 shows a perspective and cross sectional view of a moveable foot 104 in accordance with the described embodiments. The flexible sealing member 104a covers the rigid weight bearing member 104b. The flexible sealing member 104a is anchored to the rigid weight bearing member 104b via the plug 134 that can be formed around the inner portion 122 of the rigid weight bearing member during manufacture. When installed in an electronic device, a portion of the flexible sealing member 104a and the rigid weight bearing member 104b can extend through an aperture in an external casing of an electronic device.

Figure 8:
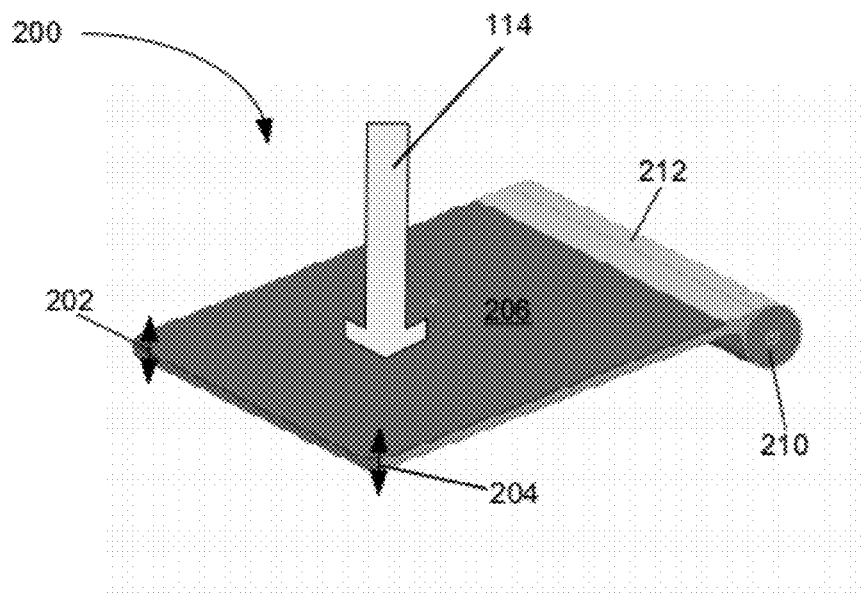
FIG. 8 shows a top perspective view of an electronic device including a moveable foot in accordance with the described embodiments.
Figure 9:
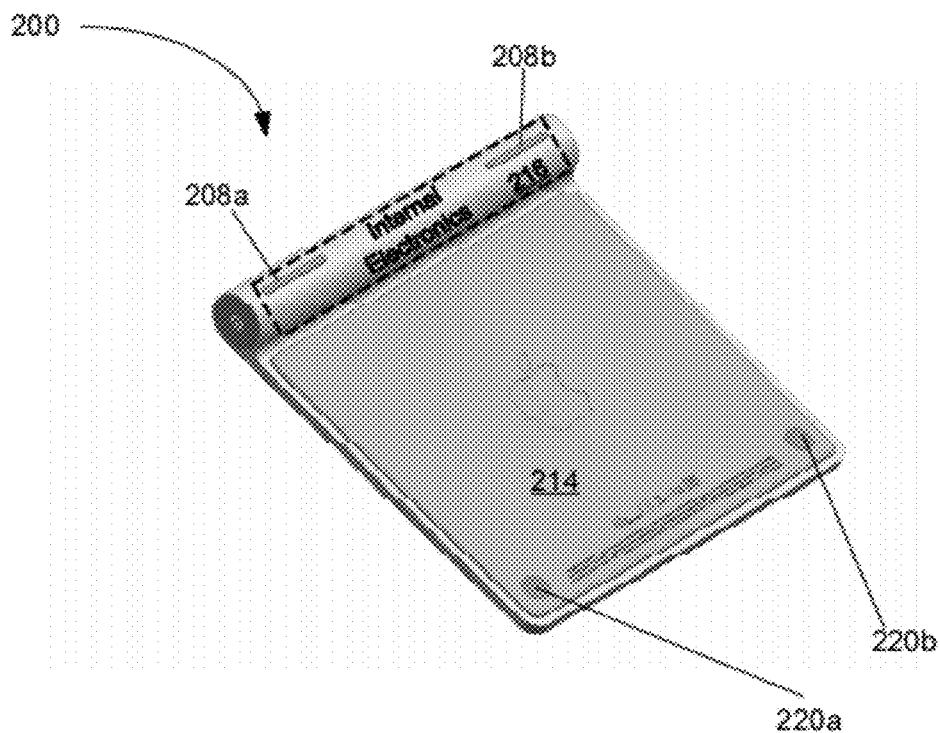
FIG. 9 shows a bottom perspective view of an electronic device including a moveable foot in accordance with the described embodiments.

FIGS. 8 and 9 show a top and a bottom perspective view of an electronic device 200 including a moveable foot in accordance with the described embodiments. The electronic device 200 can include a top surface 206 on which an external force 114, such as a touch from a user's finger(s) can be applied. The external force 114 can be input at different locations on top surface 206 and is not limited to the location shown in FIG. 8. The electronic device 200 can include one or more sensors (not shown) disposed within electronic device 200 for detecting the touch input generated by a user via force 114. In addition to the sensors configured to detect force 114 top surface 206 can include a touch-based interface for receiving touch-based inputs.

The electronic device 200 can include a cylindrical portion 212. Various electrical components 216, such as but not limited to a controller, a power supply, a communication interface and sensor circuitry can be located in cylinder 212. An input button 210 is coupled to one portion of the cylinder 212. The input button can be used to turn the electronic device 200 on or off.

The electronic device 200 includes a bottom surface 214 including two moveable feet 220a and 220b. Two stationary feet 208a and 208b can be located on the cylinder portion 212. In one embodiment, the stationary feet 208a and 208b can also be configured to move into the cylinder 212 in response to an external force like moveable feet 220a and 220b. In other embodiments, different numbers of moveable feet can be provided on the bottom surface of the electronic device. In general, one or more moveable feet can be provided.

During operation, the electronic device 200 is configured to rest on the moveable feet 104 and the stationary feet 208a and 208b. In response to the external force 114, the surface 206 can move downwards as the moveable feet 104 recess into the external casing of the electronic device 200. The movement can provide detectable feedback to a user of the electronic device 200.

The amount of movement can vary across the surface 206 of the electronic device 200. For instance, the amount of movement at corners 202 and 204 can differ depending on where the external force 114 is applied on surface 206. The different amount of movement can result from moveable foot 220a moving more than moveable foot 220b or vice versa. After the external force 114 is removed, the moveable feet, such as 220a and 220b, can return to an extended position.

Figure 10:
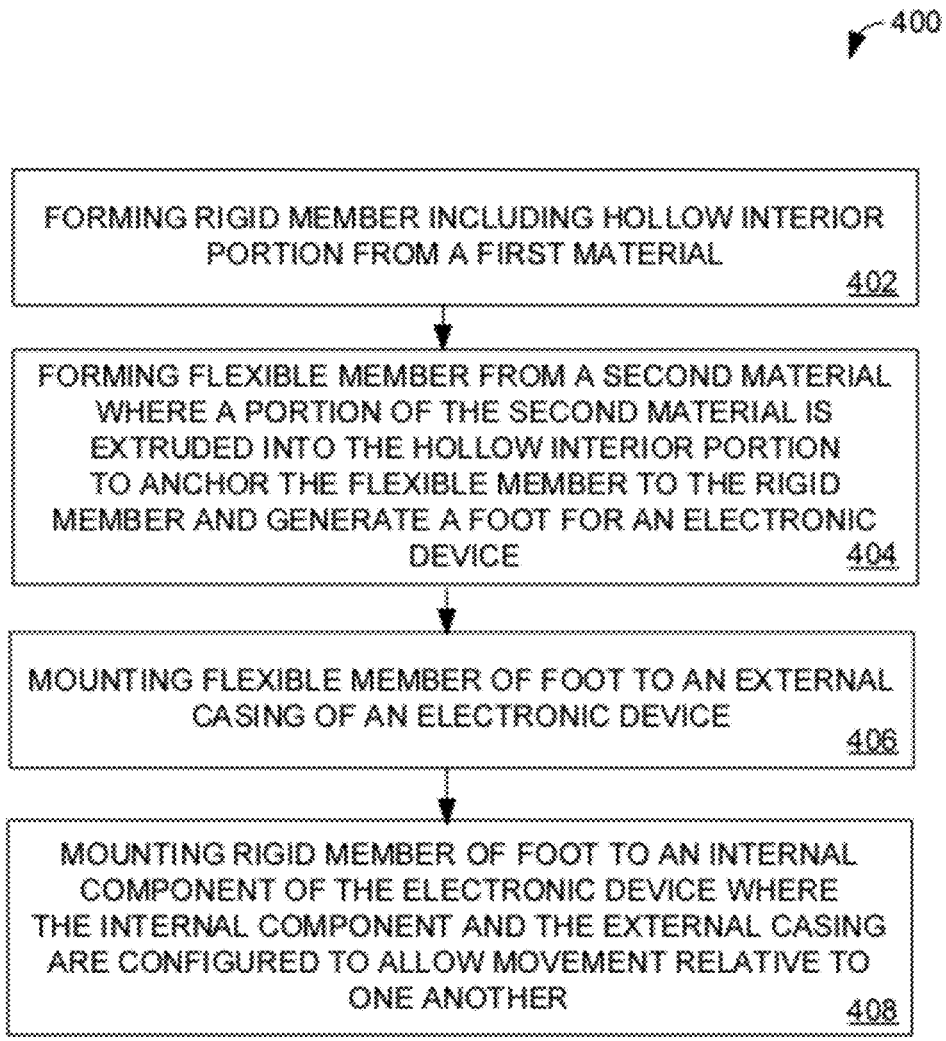
FIG. 10 is a method of forming and using a moveable foot in accordance with the described embodiments.

FIG. 10 is a method of forming and using a moveable foot in accordance with the described embodiments. In one embodiment, the moveable foot can be formed using a double shot injection molding process. In 402, in the first shot, a rigid, weight bearing member for the moveable foot can be formed from a first material. In one embodiment, the first material can be a plastic resin, such as IXEF™ (Solvay Advanced Polymers, L.L.C., Alpharetta, Ga.).

After the first shot is formed, in 404, in a second shot, a flexible sealing member of the device foot can be integrally formed with the rigid weight bearing member generated in 402. The second shot can be initiated prior to the first shot completely hardening. The material for the second shot can be selected such that it does not chemically bond with the material used to form the rigid weight bearing member. The non-bonding of the two materials allows the flexible sealing member to separate from the rigid weight bearing member when the moveable foot is installed. In one embodiment, the material for the second shot can be a thermoplastic elastomer, such as a thermoplastic polyurethane and silicon. One example of a thermoplastic elastomer is TPSiV™ (Multibase, Inc., Copley, Ohio).

The rigid weight bearing member can include a hollow interior portion. During the second shot, a portion of the second material can be extruded into the hollow interior portion to form a plug. The plug can act to anchor the flexible sealing member to the rigid weight bearing member. In other embodiments, the flexible sealing member can be integrally formed with the rigid weight bearing member using a compression molding process. In yet other embodiments, the rigid weight bearing member can be separately formed and then joined together using a bonding agent, such as double sided-tape or a liquid adhesive.

In 406 and 408, the flexible sealing member of the moveable foot can be mounted to an external casing of an electronic device and the rigid weight bearing member of the foot can be mounted to an interior portion of the electronic device. A portion of the rigid weight bearing member can extend through an aperture in the external casing. In response to an applied mechanical force, such as a mechanical force applied as part of a touch-based interface, the rigid weight bearing member can be configured to move relative to the external casing. The movement can contribute to a range of movement associated with the touch based interface.

The many features and advantages of the present invention are apparent from the written description and, thus, it is intended by the appended claims to cover all such features and advantages of the invention. Further, since numerous modifications and changes will readily occur to those skilled in the art, the invention should not be limited to the exact construction and operation as illustrated and described. Hence, all suitable modifications and equivalents may be resorted to as falling within the scope of the invention.

What is claimed is:

1. An input device, comprising:
an external casing, comprising:
a top surface configured to receive an external force in accordance with a touch event at a location on the top surface,
a sensor for detecting the touch event, the detecting in accordance with the external force, and
a bottom surface, the bottom surface comprising at least two moveable feet; and
a cylindrical portion integrally formed with the external casing, the cylindrical portion configured to enclose and support a plurality of electrical components, the cylindrical portion comprising:

a first end,
an input button at the first end of the cylindrical portion used to power on and power off the input device, and
at least one stationery foot located at a bottom side of the cylindrical portion, wherein during operation, the input device is configured to rest on the at least two moveable feet in an extended position and the stationary foot and in response to the external force, the top surface moves downwards concurrently with the at least two moveable feet recessing into the external casing in a retracted position, the movement providing detectable tactile feedback and a signal to an external circuit in communication with the input device.

2. The input device as recited in claim 1, wherein the at least one stationary foot is configured to retract into the cylinder in response to the external force.

3. The input device as recited in claim 2, wherein an amount of downward movement of a location of the top surface is in accordance with an amount of the external force at the location on the top surface.

4. The input device as recited in claim 3, wherein each of the at least two movable feet retract into the external casing an amount that corresponds to the downward movement of a location of the top surface.

5. The input device as recited in claim 4, wherein a first movable foot retracts a first amount into the external casing at a first retracted position in response to the touch event.

6. The input device as recited in claim 5, wherein a second movable foot retracts a second amount into the external casing at a second retracted position in response to the touch event.

7. The input device as recited in claim 6, wherein the first retraction amount and the second retraction amount are the same when the location of the touch event is the same distance from the first movable foot and the second movable foot.

8. The input device as recited in claim 7, wherein the input device provides a first signal to the external circuit in accordance with the first and second retraction amounts being the same.

9. The input device as recited in claim 6, wherein the first retraction amount and the second retraction amount are not the same when the location of the touch event is not the same distance from the first movable foot and the second movable foot.

10. The input device as recited in claim 9, wherein the input device provides a second signal to the external circuit in accordance with the first and second retraction amounts not being the same.

11. The input device as recited in claim 10, wherein at least one of the movable feet are coupled to at least one energy storing mechanism that acts to hold the corresponding movable foot in a first position when a magnitude of the external force is less than a threshold value.

12. The input device as recited in claim 11, wherein the energy storing mechanism is be formed from a compressible material that stores a sufficient amount of energy resulting from the compression of the compressible material to return to a pre-compressed state and return the corresponding moveable foot to an extended position when the external force is removed.

13. The input device as recited in claim 12 wherein each of the at least two moveable feet comprise:
a rigid weight bearing member including an interior hollow portion; and
a flexible sealing member integrally formed with the rigid weight bearing member;
wherein a portion of the flexible sealing member is extruded into the interior hollow portion to anchor the flexible sealing member to the rigid weight bearing member; wherein the flexible sealing member is mounted to the external casing to seal the interior of the electronic device; and
wherein the rigid weight bearing member is configured to move relative to the external casing during operation of the input device.

14. The input device of claim 13, wherein the rigid weight bearing member and the flexible sealing member are integrally formed in a double-shot injection molding process.

15. The input device of claim 14, wherein a first material for the rigid weight bearing member and a second material for the flexible sealing member are selected so that the first and the second materials do not stick or bond together during the double-shot injection molding process.

16. An electronic device comprising:
a casing;
a touch-based interface;
a foot mounted within the casing and extending outside the casing through an aperture of the casing, the foot configured to carry a portion of the weight of the electronic device and to contribute to a range of movement associated with the touch-based interface; and
a switch disposed within the casing and configured to receive an external force through the foot, wherein the switch provides a signal indicating the external force has been detected when the external force transmitted by the foot actuates the switch.

17. The electronic device of claim 16, wherein the foot comprises:
a flexible sealing member mounted to an external surface of the casing; and
a rigid weight bearing member integrally formed with the flexible sealing member.

18. The electronic device of claim 17, wherein the rigid weight bearing member is configured to move relative to the casing during operation of the electronic device to contribute to the range of movement associated with the touch-based interface.

19. The electronic device of claim 17, wherein the foot further comprises a spring configured to resist force applied against a top surface of the touch-based interface.

20. The electronic device of claim 16, further comprising another foot mounted within the casing that cooperates with the foot to carry the portion of the weight of the electronic device and to contribute to the range of movement associated with the touch-based interface.

* * * * *

UNITED STATES PATENT AND TRADEMARK OFFICE
CERTIFICATE OF CORRECTION

PATENT NO. : 8,941,990 B2  
APPLICATION NO. : 13/489345  
DATED : January 27, 2015  
INVENTOR(S) : Erik A. Uttermann et al.

Page 1 of 1

It is certified that error appears in the above-identified patent and that said Letters Patent is hereby corrected as shown below:

In the Claims:

Column 11, lines 16-17 (Claim 2, lines 2-3): "the cylinder" should read --the cylindrical portion--.

Column 11, line 36 (Claim 7, line 4): both occurrences of the word "the" should read --a--.

Column 11, line 44 (Claim 9, line 4): both occurrences of the word "the" should read --a--.

Column 12, line 14 (Claim 13, line 12): "electronic device" should read --external casing--.

Signed and Sealed this
Twenty-first Day of April, 2015

Michelle K. Lee  
*Director of the United States Patent and Trademark Office*